（12）United States Patent
Bonnet et al.

(10) Patent No.: US 9,609,740 B2
(45) Date of Patent: Mar. 28, 2017

(54) COOLED PRINTED CIRCUIT WITH MULTI-LAYER STRUCTURE AND LOW DIELECTRIC LOSSES

(71) Applicant: THALES, Courbevoie (FR)

(72) Inventors: Sebastien Bonnet, Courbevoie (FR); Serge Verdeyme, Limoges (FR); Michel Campovecchio, Limoges (FR); Alain Dravet, St Remy l'Honore (FR); Marc-Yves Lienhart, Paris (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 14/897,615

(22) PCT Filed: Jun. 10, 2014

(86) PCT No.: PCT/EP2014/061968
§ 371 (c)(1),
(2) Date: Dec. 10, 2015

(87) PCT Pub. No.: WO2014/198688
PCT Pub. Date: Dec. 18, 2014

(65) Prior Publication Data
US 2016/0135280 A1 May 12, 2016

(30) Foreign Application Priority Data

Jun. 12, 2013 (FR) .................................... 13 01342

(51) Int. Cl.
*H05K 1/00* (2006.01)
*H05K 1/02* (2006.01)
(Continued)

(52) U.S. Cl.
CPC ......... *H05K 1/0203* (2013.01); *H05K 1/0204* (2013.01); *H05K 1/115* (2013.01);
(Continued)

(58) Field of Classification Search
CPC ...... H05K 1/00; H05K 1/0203; H05K 1/0204; H05K 1/115; H05K 1/183; H05K 3/0011; H05K 3/40
(Continued)

(56) References Cited

U.S. PATENT DOCUMENTS 5,459,639 A 10/1995 Izumi
2004/0060173 A1 4/2004 Ledain et al.
(Continued)

FOREIGN PATENT DOCUMENTS

EP 0 197 148 A1 10/1986
EP 1 643 552 A1 4/2006
(Continued)

*Primary Examiner* — Tremesha S Willis
(74) *Attorney, Agent, or Firm* — Baker & Hostetler LLP

(57) ABSTRACT

The printed circuit with a multi-layer structure comprises: a first layer machined to form a spotface passing through the layer, a second layer comprising a first cavity passing through the layer, a third layer comprising, on one face, an electronic component that is in the first cavity, a fourth layer comprising a second cavity, a heat-conducting element with two parts: one made of metal, called a thermal cover, inserted into the spotface of the first layer so as to close, mechanically and electrically, the first cavity, the other made of a dielectric material with heat conduction >30 W/(m·K), placed in the first cavity so as to be in contact with the electronic component.

18 Claims, 2 Drawing Sheets

(51) Int. Cl.
*H05K 1/11* (2006.01)
*H05K 1/18* (2006.01)
*H05K 3/00* (2006.01)
*H05K 3/40* (2006.01)
*H05K 3/46* (2006.01)

(52) U.S. Cl.
CPC ........... *H05K 1/183* (2013.01); *H05K 3/0011* (2013.01); *H05K 3/40* (2013.01); *H05K 3/4644* (2013.01); *H05K 3/4697* (2013.01); *H05K 1/0237* (2013.01); *H05K 3/4623* (2013.01); *H05K 2201/09072* (2013.01); *H05K 2201/09845* (2013.01); *H05K 2201/1056* (2013.01); *H05K 2201/10416* (2013.01)

(58) Field of Classification Search
USPC .................................. 174/250–252, 255–262
See application file for complete search history.

(56) References Cited

U.S. PATENT DOCUMENTS

| | | |
|---|---|---|
| 2005/0180111 A1 | 8/2005 | Bamesberger et al. |
| 2006/0133043 A1 | 6/2006 | Boudreaux et al. |
| 2007/0297155 A1 | 12/2007 | Hebel et al. |

FOREIGN PATENT DOCUMENTS

| | | |
|---|---|---|
| EP | 1 901 406 A1 | 3/2008 |
| FR | 2 960 377 A1 | 11/2011 |
| WO | 2004/103038 A1 | 11/2004 |

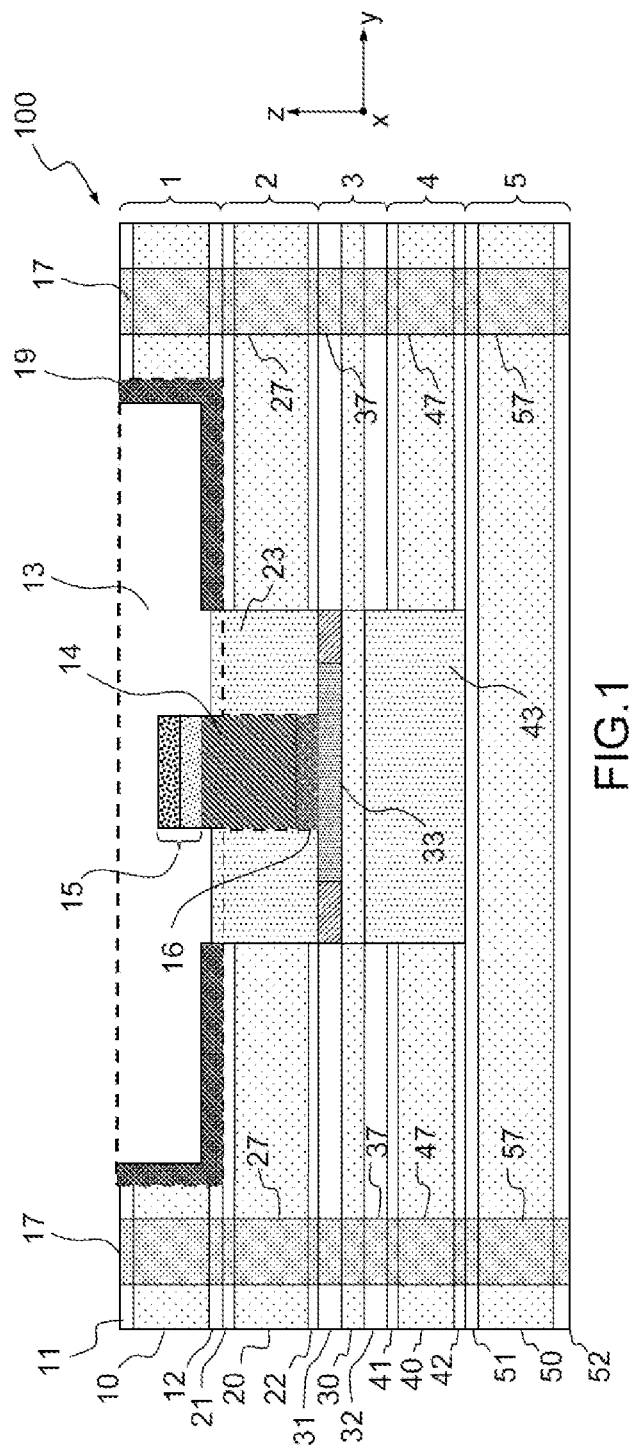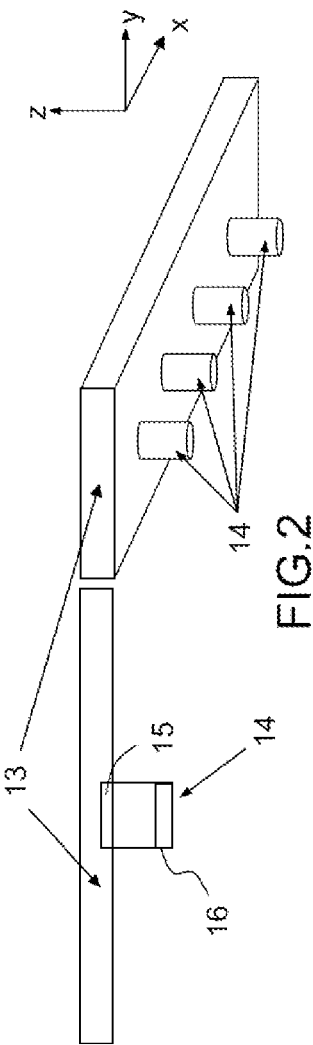

COOLED PRINTED CIRCUIT WITH MULTI-LAYER STRUCTURE AND LOW DIELECTRIC LOSSES

CROSS-REFERENCE TO RELATED APPLICATIONS

This application is a National Stage of International patent application PCT/EP2014/061968, filed on Jun. 10, 2014, which claims priority to foreign French patent application No. FR 1301342, filed on Jun. 12, 2013, the disclosures of which are incorporated by reference in their entirety.

FIELD OF THE INVENTION

The invention relates to the field of printed boards, and more specifically a printed circuit with a multi-layer structure.

BACKGROUND

The antennas of certain airport radars carry out an electronic scan of the beam in a single plane. In the plane in which the beam is fixed, so as to reduce costs, sub-arrays of N radiating elements are fed by a single active channel, by means of an RF divider 1:N, a divider being made up of an assembly of power splitters, linked together by sections of transmission line.

In order to implement the front-end RF divider between the active channel and the N radiating elements, the use of stripline dielectric technology is known, compatible with the multi-layer printed circuit which also contains the active components and the radiating elements.

The dielectric used is typically a commercially available substrate which has the advantage of great technological maturity and a low cost. Nevertheless it has the drawbacks of a low thermal conductivity of 0.64 W/(m·K) and high dielectric losses, of the order of 10 dB/m or even more, which impair the emitting (EIRP) and receiving (G/T) performances of the antenna.

At the end of the 1990s, a method was developed for heat dissipation in an air-line structure in a metallic waveguide. This cooling method, consisting in inserting, at regular intervals along the line, ceramic pads between the central path of the air line and the metallic ground of the waveguide, was used in an RF divider made up of hybrid rings for the demonstration antenna SAREX ("Experimental X-Band SAR Radar"). This structure has the drawback of relatively high volume and mass; it cannot be integrated in a multi-layer printed circuit.

Consequently, to this day there remains a need for a printed circuit simultaneously satisfying all of the aforementioned demands, in terms of minimizing its dielectric losses and its heating.

SUMMARY OF THE INVENTION

More specifically, the subject of the invention is a printed circuit with a multi-layer structure. It is mainly characterized in that it comprises:

a first layer comprising a dielectric material between two metalized faces, machined so as to form a spotface passing through the layer for the entirety of its thickness, a second layer comprising a dielectric material between two metalized faces and comprising a first cavity passing through the layer for the entirety of its thickness, assembled on the first layer in such a way that this first cavity is facing the spotface, a third layer comprising a dielectric material between two metalized faces and comprising, on one face, an electronic component occupying a surface Scomp, the other face being without metal on a section ≥Scomp, this third layer being assembled on the second layer in such a way that the component is in the first cavity, a fourth layer comprising a dielectric material between two metalized faces and comprising a second cavity, assembled on the third layer in such a way that this second cavity is facing the first cavity, a heat-conducting element with two parts:
   one made of metal, called a thermal cover, inserted into the spotface of the first layer in such a way as to close, mechanically and electrically, the first cavity,
   the other made of a dielectric material with heat conduction >30 W/(m·K), brazed to the first part and placed in the first cavity (23) in such a way as to be in contact with the electronic component (33) so as to ensure thereby a heat conduction.

Such a printed circuit makes it possible to minimize the heating and the dielectric losses of the electronic component placed in a cavity integrated in a multi-layer structure.

The second cavity can pass through the fourth layer for the entirety of its thickness; in this case it comprises a fifth layer with two metalized faces and assembled on the fourth layer.

According to one embodiment, the third layer comprises, between its metalized faces, a first underlayer of adhesive supporting the electronic component and a second underlayer comprising a third cavity which potentially comprises one or more reinforcements.

According to one feature of the invention, the cross sections of the cavities are equal.

The thermal cover advantageously comprises a spotface into which the second part is inserted in the form of a thermal pad.

The circuit potentially comprises shielding through covering of the cavities by a layer of metalization and/or by metalized vias on the sides of the printed circuit.

The invention also relates to a method for manufacturing a printed circuit such as described, characterized in that it comprises:
   production steps for a sub-assembly which comprise:
   preparation of each layer,
   assembly of the layers,
   machining of the first layer in such a way as to form the spotface,
   a production step for the heat-conducting element by assembling the thermal pad on the cover,
   a step for inserting the heat-conducting element into the spotface of the first layer so as to be in contact with the electronic component, after having added:
   a heat-conducting and electrically insulating adhesive on the face of the pad intended to be in contact with the component,
   an electrically conductive adhesive on the faces of the cover intended to be in contact with the first layer,
   polymerization of the conducting element.

Advantageously, at least two layers are assembled by thermodiffusion.

Preferentially, the step b) preliminarily comprises the assembly of the pad, a machining of the cover in such a way as to form a notch intended to accommodate part of the pad.

More specifically, the step for the preparation of the layers comprises, for example:

preparation of the materials of the first layer, preparation of the materials of the second layer and machining of the first cavity, preparation of the materials of the third layer and placement of the electronic component, preparation of the materials of the fourth layer and machining of the second cavity.

This step for the preparation of the layers potentially comprises the preparation of the materials of the fifth layer.

The step for the preparation of the third layer generally comprises a step for the deposition of a layer of adhesive on the dielectric material, then placement of the component on the adhesive, then machining of a third cavity under the electronic component, intended to be facing the second cavity.

Reinforcements can be arranged in the third cavity.

BRIEF DESCRIPTION OF THE DRAWINGS

Other features and advantages of the invention will become apparent upon reading the detailed description which follows, given by way of non-limitative example and with reference to the appended drawings in which:

FIG. 1 diagrammatically shows an example of a printed circuit according to the invention, FIG. 2 diagrammatically shows an example of a conducting element, FIG. 3 diagrammatically illustrates steps of an exemplary method for manufacturing a printed circuit according to the invention.

DETAILED DESCRIPTION

Figure 3:
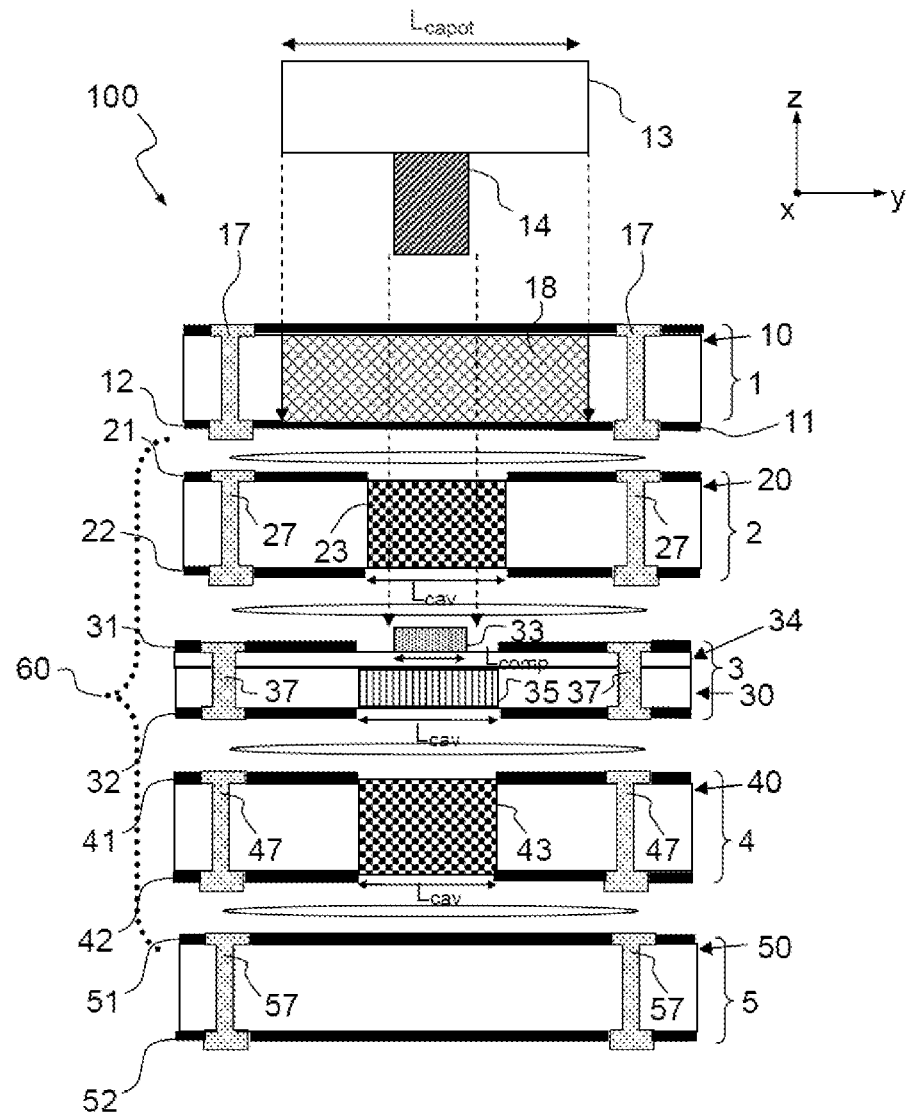

Throughout the figures, the same elements are denoted by the same references.

In the following description, the expressions "high", "low", "above" (or "on"), "below" (or "under"), "upper", "lower" "front", "back", "side", etc., are used in reference to the orientation of the figures described. Insofar as the device can be positioned according to other orientations, the directional terminology is indicated by way of illustration and is not limitative.

In order to improve the transmitting and receiving performances of the antenna, it is essential to minimize the heating of the RF power transmission structures, or more generally of an electronic component. This heating, linked to the power dissipated into this structure, is directly associated with the front-end losses between the active channel and the N radiating elements, i.e. the losses of the RF divider.

FIG. 1 shows a cross section of a printed circuit 100 according to the invention with an electronic component 33 on a thin dielectric substrate 30. The lower 4 and upper 2 layers of this substrate are machined so as to form air cavities 23 and 43, around the electronic component 33. These air cavities form a thermal insulator around the electronic component, and slow the dissipation of heat when the component is subjected to high RF powers. The electronic component is therefore cooled by an element 13, 14 with heat conduction >30 W/(m·K), fixed on this electronic component.

This structure will now be described in more detail.

This heat-conducting element comprises a metallic upper part 13 (for example made of copper or silver or metalized diamond or copper+pieces of metalized diamond or made of a composite of the type: silver-diamond, copper-diamond, aluminum-diamond, aluminum-silicon) called a thermal cover, to which a thermal pad 14 (or multiple) is fixed, for example made of ceramic. Any type of ceramic can be used, in particular aluminum nitride (AlN), alumina ($Al_2O_3$), boron nitride (BN), beryllium oxide (BeO), diamond (C), etc. These materials possess thermal conductivities from 33 W/(m·K) (for alumina) to 1800 W/(m·K) (for diamond).

One of the circular faces of the ceramic pad 14 is brazed with a brazing metal 15 on the machined copper cover 13. This cover, which closes the cavity 23, serves as a support on the layer 2, as well as serving as an electrical ground above the air cavity. The other circular face of the ceramic pad 14 is glued on the electronic component 33, thus determining its thickness; it is glued by means of an electrically insulating and heat-conducting adhesive 16.

This generally cylindrical pad has a diameter of between 0.5 mm and 0.7 mm and a thickness of between 400 μm and 500 μm. The metallic copper cover on which the ceramic pad (or pads) is fixed has a thickness of between 400 μm and 800 μm.

The dimensions of the cover and of the thermal pads are determined in accordance with the thicknesses of the layers.

In order to carry out a constant cooling over the whole of the electronic component, it is advantageously possible to distribute multiple pads 14 periodically along the cover 13 (as shown in FIG. 2) and therefore along the component. A spacing of the order of 20% of the total length of the structure has been used.

A first upper layer 1, comprising a dielectric material 10 (generally comprising only this dielectric material) between two metalized faces 11, 12, is machined so as to form a spotface 18 (as shown in FIG. 3) with cross section Scap (along the plane of the layers, i.e. along the axes X and Y) passing through the layer 1 for the entirety of its thickness (i.e. along the axis Z), into which the thermal cover 13 is inserted.

A second layer 2, comprising a dielectric material 20 between two metalized faces 21, 22 (and comprising only this dielectric material 20), comprises a first cavity 23 with cross section Scav passing through the layer 2 for the entirety of its thickness, and is assembled on the first layer 1 in such a way that this first cavity is facing the spotface. The thermal pad or pads 14 are in this cavity 23. When the electronic component is a transmission line, this cavity forms a channel and the conducting element advantageously comprises multiple thermal pads as shown in FIG. 2, which are fixed to the line.

A third layer 3, comprising a dielectric material 30 between two metalized faces 31, 32 (and comprising only this dielectric material 30), comprises on one face the electronic component 33 placed facing the first cavity 23 and which occupies a surface Scomp; the other face is without metal on a section ≥Scomp, typically equal to Scav; this third layer is assembled on the second layer in such a way that the component 33 is in the first cavity 23. This dielectric material 30, which forms the substrate of the electronic component, is a commercially available organic substrate with low losses, of the same type as the dielectric material in which the first cavity is formed, but with a smaller thickness.

In the case of a structure integrating an air-dielectric stripline propagation line, the electronic component 33 is a central copper path, with a rectangular cross section, which is etched on the substrate of the layer 3. The typical thickness of the central path of a dielectric stripline is between 30 μm and 50 μm. In order to reduce the metallic losses, it is proposed to increase the thickness of the path, within reasonable limits so as to retain the usual manufacturing techniques. A path with a thickness of between 50 μm and 200 μm is a good compromise between losses and feasibility. The width of the path is optimized so as to obtain the desired characteristic impedance, in general 50Ω.

According to a first embodiment corresponding to FIG. 3, the substrate on which the electronic component 33 is etched is obtained from a film of adhesive 34. The thickness of the film of adhesive is between 30 μm and 100 μm. The film of adhesive rests on a thin organic substrate 30, which is hollowed out, in the vicinity of the path, by machining, so as to reduce the losses. Reinforcements are potentially arranged in this hollow 35, also called the third cavity, so as to reinforce the mechanical support of the component 33 on the film of adhesive. The assembly "film of adhesive+substrate" is metalized on the two faces 31, 32 with a layer of copper and a gold (Au) finish, compatible with the assembly process.

According to a second embodiment corresponding to FIG. 1, the electronic component 33 is directly etched on the substrate 30 of the layer 3.

A fourth layer 4 comprising a dielectric material 40 between two metalized faces 41, 42 (and comprising only this dielectric material 40) comprises a second cavity 43 of the same cross section Scav as the first cavity 23, and is assembled on the third layer 3 in such a way that this second cavity is facing the first cavity.

Preferentially, this second cavity 43 passes through this layer 4 for the entirety of its thickness, like the first cavity and as shown in the example in FIG. 3. In this case, a fifth layer 5 comprising a dielectric material 50 between two metalized faces 51, 52 is assembled on the fourth layer. This fifth layer can also be a multi-layer comprising for example a stack of multiple elementary circuits.

These cavities are typically filled with air as indicated, but more generally they can be filled with a cooling fluid.

We have: Scap>Scav, where typically Scap>1.5×Scav and Scav>Scomp.

In the Figures, the corresponding dimensions along the axis Y are shown: Lcap, Lcav and Lcomp.

The faces of the layers are for example metalized with a layer of copper and a tin (Sn) or gold (Au) or silver (Ag) finish, compatible with an assembly process by thermodiffusion.

In the example in FIG. 1, the lower 4, 5 and upper 1, 2 layers have a thickness of between 200 μm and 500 μm. It is possible to choose the thickness of the layer 3, in accordance with the applications.

For a printed circuit with a central path made of copper etched on a substrate, the introduction of the heat-conducting element results in a decrease in the maximum temperature of 47° C. for a substrate of around 100 μm as for the second embodiment, and of 40° C. for a substrate of around 50 μm as for the first embodiment.

In the X band from 8000 to 12000 MHz, the linear losses of this air-stripline structure are typically 5 to 6 dB/m, instead of 10 to 11 dB/m for a solid dielectric stripline structure using commercially available organic substrates. This constitutes a very significant gain in the power budget, above all on the front-end structure of an active antenna.

The electronic component 33 can be electrically shielded, which is advantageous when it is a propagation line. It is for example shielded on the sides by metalized holes 17, 27, 37, 47, 57 (also called "vias") or equivalent. The metalized holes have for example a diameter of 0.3 mm, imposed by the height of the stack of the layers. The implantation rules impose a minimum distance of 0.25 mm between the edge of the vias and the air cavity. They also impose a minimum distance of 1.5 mm between the edge of the vias and the edge of the printed circuit.

The metalized holes can be replaced by continuous metallic walls, if the production technology for the multi-layer printed circuit so allows.

Potentially, the walls of these cavities can be metalized in order to produce this shielding.

An exemplary method for manufacturing a multi-layer printed circuit according to the invention will now be described. The layers can be assembled by means of films of adhesive. They are preferentially assembled by thermodiffusion; the assembly method for the metalized faces is by mechanical pressure and temperature. This makes it possible to conserve constant thicknesses during collective manufacture, without subsidence as can happen with assembly by adhesive bonding of metalized layers, and thus to guarantee the same electrical and thermal properties for each of the circuits. This assembly technique, such as described in patent application EP1350418, has the advantage of a significant reduction in the manufacturing costs of the multi-layer printed circuit, and of a flexibility in the achieving of connections in the Z axis between various elementary circuits, difficult to achieve through the conventional methods for manufacturing printed boards; in effect assembly by thermodiffusion makes it possible to avoid the risks of creep due to the film of adhesive used in the conventional methods.

The assembly technology also makes it possible to wire components buried inside the multi-layer printed circuit, for example: resistors or active components.

This method makes it possible to assemble metalized layers with a different finish, for example:
gold finish for one layer,
tin finish for the layer facing it.

In order to produce a printed circuit such as that in the example in FIG. 1, the procedure according to the following steps illustrated in FIG. 3 is used:
Step 1 is the preparation of each layer 1, 2, 3, 4 and 5: machining, counterboring for example for creating the cavities, or even pressing of the underlayers, forming a layer as for the first embodiment of layer 3.
Step 2 is the drilling of vias in each layer.
Step 3 is the metalization of the vias and a gold (Au) finish of 3 μm for each layer.
Step 4 is the assembly of the layers together with pressing by thermodiffusion of at least two layers. In the example in FIG. 3, all of the layers are assembled by thermodiffusion: four interfaces are thermodiffused in one pressing, thus guaranteeing good reproducibility of the cavities during collective manufacture. Five distinct layers are thus assembled.
Step 5 is the machining of the first layer for the purpose of inserting therein the conducting element 13, 14.

These steps can be linked together in the order indicated. The steps 2 and 3 can potentially occur after the assembly step.

The sub-assembly thus produced can next be integrated in a multi-layer circuit of greater complexity, either by adding more layers into the stack (a multi-layer under the layer 5 can be added, for example), or by increasing the dimensions in the X and Y axes, or by combining both. This method makes it possible to produce, industrially, cavities which are easily integrated in any RF frequency or low-frequency multi-layer circuit.

The heat-conducting element is manufactured then assembled on this sub-assembly.

It is manufactured by machining the copper cover 13 of the diameter of the thermal pad 14 in such a way as to create a notch for the insertion of a part of the ceramic pad. Next the ceramic pad 14 is assembled on the copper cover 13 by brazing 15.

The conducting element is next inserted into the space intended for this purpose in the first layer 1 of the sub-assembly previously assembled as shown in FIGS. 1 and 3 by:
- adding an electrically insulating and heat-conducting adhesive 16 (shown in FIG. 1) at the extremity of the thermal pad 14 in such a way as to put it in contact with the electronic component 33 to be cooled,
- adding an electrically conducting adhesive 19 around the copper cover.

The conducting element is then polymerized so as to make it airtight.

This method for assembling ceramic pads on a copper cover is not limitative at the level of the components of the ceramic materials or the dimensions of the pads and of the copper cover.

The invention was described using the example of a printed circuit with cavities so as to produce low-loss air lines, but it is also possible to produce, in the same manner, any type of cavity able to be integrated in a multi-layer for various electronic components, such as suspended filters, active or passive components such as resistors.

The invention claimed is:

1. A printed circuit with a multi-layer structure, comprising:
    a first layer comprising a dielectric material between two metalized faces, machined so as to form a first spotface passing through the first layer for an entirety of its thickness,
    a second layer comprising a dielectric material between two metalized faces and comprising a first cavity passing through the second layer for an entirety of its thickness, assembled on the first layer in such a way that this first cavity is facing the spotface,
    a third layer comprising a dielectric material between two metalized faces and comprising, on one face, an electronic component occupying a surface Scomp, an other face being without metal on a section ≥Scomp, this third layer being assembled on the second layer in such a way that the component is in the first cavity,
    a fourth layer comprising a dielectric material between two metalized faces and comprising a second cavity, assembled on the third layer in such a way that this second cavity is facing the first cavity,
    a heat-conducting element with two parts:
        a first part made of metal, called a thermal cover, inserted into the first spotface of the first layer in such a way as to close, mechanically and electrically, the first cavity,
        a second part made of a dielectric material with heat conduction >30 W/(m·K), brazed to the first part and placed in the first cavity in such a way as to be in contact with the electronic component so as to ensure thereby a heat conduction.

2. The printed circuit as claimed in claim 1, wherein the second cavity passes through the fourth layer for an entirety of its thickness and comprising a fifth layer with two metalized faces and assembled on the fourth layer.

3. The printed circuit as claimed in claim 1, wherein the third layer comprises, between its metalized faces, a first underlayer of adhesive supporting the electronic component and a second underlayer comprising a third cavity.

4. The printed circuit as claimed in claim 3, wherein one or more reinforcements are arranged in the third cavity.

5. The printed circuit as claimed in claim 1, wherein the cross sections of the cavities are equal.

6. The printed circuit as claimed in claim 1, wherein the thermal cover comprises a second spotface into which the second part is inserted in the form of a thermal pad.

7. The printed circuit as claimed in claim 1, comprising metalized vias ensuring an electrical interconnection of the layers.

8. The printed circuit as claimed in claim 1, wherein the electronic component is a transmission line or a filter or a resistor.

9. The printed circuit as claimed in claim 1, wherein the heat-conducting element comprises, as second part, multiple thermal pads brazed to the same thermal cover.

10. The printed circuit as claimed in claim 9, wherein the electronic component is a transmission line in contact with the pads.

11. The printed circuit as claimed in claim 1, comprising shielding through covering of the cavities by a layer of metalization and/or by metalized vias on the sides of the printed circuit.

12. A method for manufacturing a printed circuit as claimed in claim 1, comprising:
    production steps for a sub-assembly which comprise:
        preparation of each layer,
        assembly of the layers,
        machining of the first layer in such a way as to form the first spotface,
    a production step for the heat-conducting element by assembling a thermal pad on the cover,
    a step for inserting a heat-conducting element into the first spotface of the first layer so as to be in contact with the electronic component, after having added:
        a heat-conducting and electrically insulating adhesive on the face of the pad intended to be in contact with the component,
        an electrically conductive adhesive on the faces of the cover intended to be in contact with the first layer, and
    polymerization of the conducting element.

13. The method as claimed in claim 12, wherein at least two layers are assembled by thermodiffusion.

14. The method as claimed in claim 12, wherein the production step for the heat-conducting element preliminarily comprises assembly of the thermal pad, a machining of the cover in such a way as to form a notch intended to accommodate part of the thermal pad.

15. The method as claimed in claim 12, wherein the step for the preparation of the layers comprises:
    preparation of materials of the first layer,
    preparation of materials of the second layer and machining of the first cavity,
    preparation of materials of the third layer and placement of the electronic component,
    preparation of materials of the fourth layer and machining of the second cavity.

16. The method as claimed in claim 12, wherein the step for the preparation of the layers comprises the preparation of materials of fifth layer, and wherein the second cavity passes through the fourth layer for an entirety of its thickness and comprising a fifth layer with two metalized faces and assembled on the fourth layer.

17. The method as claimed in claim 12, wherein the step for the preparation of the third layer comprises a step for deposition of a layer of adhesive on the dielectric material, then placement of the electronic component on the adhesive, then machining of a third cavity under the layer of adhesive intended to be facing the second cavity.

18. The method as claimed in claim 17, wherein reinforcements are arranged in the third cavity.

\* \* \* \* \*